(12) United States Patent
Loeda et al.

(10) Patent No.: US 9,143,105 B2
(45) Date of Patent: Sep. 22, 2015

(54) SIGMA-DELTA MODULATOR APPROACH TO INCREASED VOLUME RESOLUTION IN AUDIO OUTPUT STAGES

(75) Inventors: Sebastian Loeda, Edinburgh (GB); Andrew Terry, Picton (AU)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 701 days.

(21) Appl. No.: 13/299,873

(22) Filed: Nov. 18, 2011

(65) Prior Publication Data

US 2013/0120060 A1    May 16, 2013

(30) Foreign Application Priority Data

Nov. 14, 2011   (EP) ..................... 11368026

(51) Int. Cl.
*H03F 99/00* (2009.01)
*H03G 1/00* (2006.01)
*H03G 3/00* (2006.01)
*H03F 3/217* (2006.01)

(52) U.S. Cl.
CPC ............. *H03G 1/0088* (2013.01); *H03G 3/001* (2013.01); *H03F 3/217* (2013.01); *H03F 3/2173* (2013.01); *H03F 2200/345* (2013.01)

(58) Field of Classification Search
CPC ....... H03G 1/0088; H03G 3/001; H03G 3/30; H03G 3/3026; H03F 3/217; H03F 3/2173; H03F 3/2175; H03F 1/26; H03F 1/32; H03F 1/34; H03F 1/0211; H03F 2203/45528; H03F 2203/45534; H03F 2200/331; H03F 3/72; H03F 3/2178; H03F 3/45475; H03F 2200/345; H03F 2200/351

USPC .................. 330/10, 51, 86, 282, 251, 207 A; 381/120, 121, 118, 123

See application file for complete search history.

(56) References Cited

U.S. PATENT DOCUMENTS

| | | | |
|---|---|---|---|
| 4,555,668 A | 11/1985 | Gregorian et al. |
| 4,873,492 A | 10/1989 | Myer |
| 4,910,797 A | 3/1990 | Min et al. |
| 5,233,309 A | 8/1993 | Spitalny et al. |
| 5,486,791 A | 1/1996 | Spitalny et al. |
| 6,127,893 A | 10/2000 | Llewellyn et al. |
| 6,404,367 B1 | 6/2002 | Van der Zwan et al. |
| 6,424,221 B1 | 7/2002 | Korn |

(Continued)

FOREIGN PATENT DOCUMENTS

WO   WO 2008/031072   3/2008

OTHER PUBLICATIONS

European Search Report—11368026.8-1233 Mail date—Mar. 6, 2012.

(Continued)

*Primary Examiner* — Xu Mei
(74) *Attorney, Agent, or Firm* — Saile Ackerman LLC; Stephen B. Ackerman

(57) ABSTRACT

A variable gain analog amplifier is described that uses pulse-density modulation in the form of a sigma-delta modulator (SDM) to produce a gain by modulating the selection of a switch that selects the amount of resistance in a negative feedback loop of the amplifier. The output of the SDM is dithered to increase the gain resolution of the analog amplifier, wherein the increased resolution produces a quiet, inaudible transition between changes in gain setting at an output of the variable gain amplifier and in addition produces a quiet, inaudible mixing and merging of audio signals.

16 Claims, 3 Drawing Sheets

(56) References Cited

U.S. PATENT DOCUMENTS

| | | |
|---|---|---|
| 6,888,405 B2 | 5/2005 | Cheung et al. |
| 6,958,648 B2 | 10/2005 | Cheung et al. |
| 7,026,875 B2 | 4/2006 | Sobel |
| 7,102,441 B2 | 9/2006 | Lee et al. |
| 7,148,829 B2 | 12/2006 | Inukai |
| 7,268,715 B2 | 9/2007 | Guimaraes |
| 7,417,506 B2 | 8/2008 | Klein et al. |
| 7,515,310 B2 | 4/2009 | Llewellyn et al. |
| 7,545,209 B2 | 6/2009 | Hughes |
| 7,545,210 B2 | 6/2009 | Hughes |
| 7,583,213 B2 | 9/2009 | Wang et al. |
| 7,605,659 B2 | 10/2009 | Hughes |
| 7,733,174 B2 | 6/2010 | Sharma et al. |
| 7,821,341 B2 | 10/2010 | Kim et al. |
| 7,986,250 B2 | 7/2011 | Galton et al. |
| 8,324,969 B2 * | 12/2012 | Loeda et al. .................. 330/282 |
| 2008/0252378 A1 * | 10/2008 | Hughes ......................... 330/284 |
| 2009/0096528 A1 | 4/2009 | Nakai et al. |
| 2010/0166084 A1 | 7/2010 | Galton et al. |
| 2010/0244952 A1 * | 9/2010 | Kamibayashi ................ 330/135 |

OTHER PUBLICATIONS

Co-pending U.S. Appl. No. 13/065,301, filed Mar. 18, 2011, "A Deltla-Sigma Modulator Approach to Increased Amplifier Gain Resolution," assigned to the same assignee as the present invention, 34 pgs.

"Spurious Tone Suppression Techniques Applied to a Wide-Bandwidth 2.4 GHz Fractional-N PLL," by Kevin J. Wang et al., IEEE Journal of Solid-State Circuits, vol. 43, No. 12, Dec. 2008, pp. 2787-2797.

"Periodic-Switched Filter Networks—A Means of Amplifying and Varying Transfer Functions," by James A Kaehler et al., IEEE Journal of Solid-State Circuits, vol. SC-4, Aug. 1969, pp. 225-230.

* cited by examiner

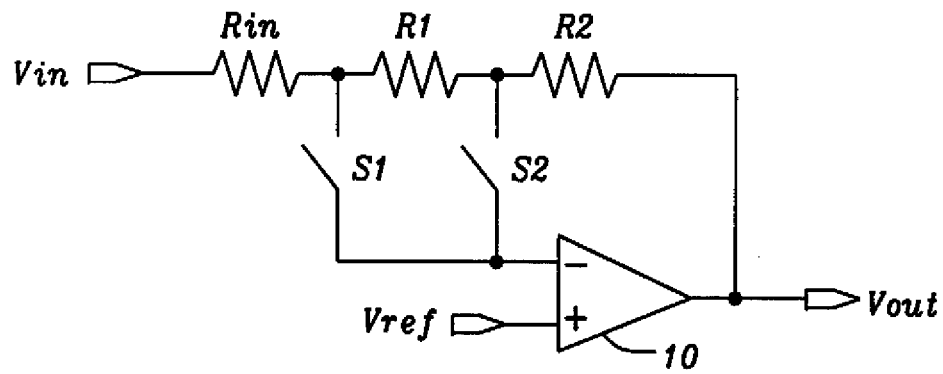
FIG. 1 - Prior Art
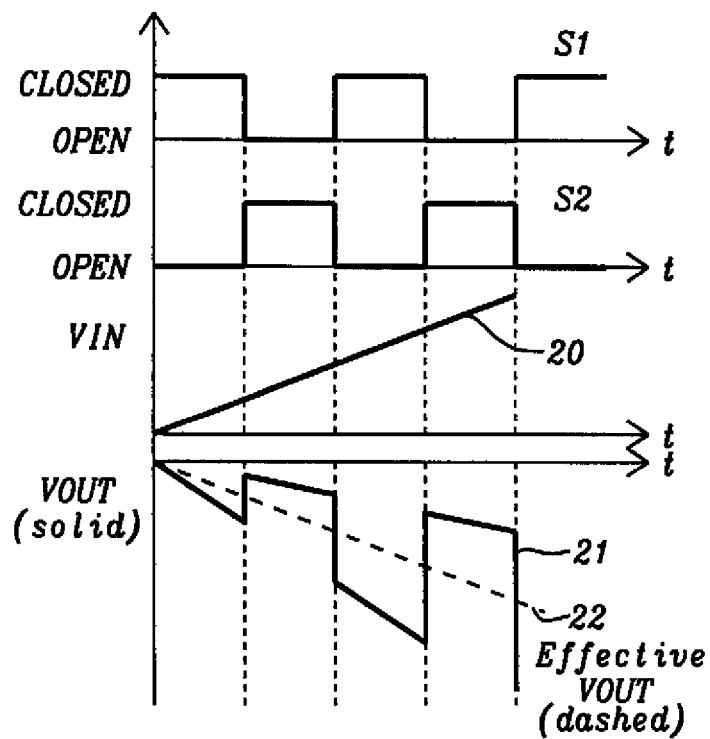
FIG. 2 - Prior Art

SIGMA-DELTA MODULATOR APPROACH TO INCREASED VOLUME RESOLUTION IN AUDIO OUTPUT STAGES

This application is related to U.S. patent application Ser. No. 13/065,301, filed on Mar. 18, 2011, assigned to the same assignee as the present invention, and which is herein incorporated by reference in its entirety.

BACKGROUND OF THE INVENTION

1. Field of Invention

The present invention is related to audio amplifiers and in particular to increasing gain resolution of output stages of audio amplifiers.

2. Description of Related Art

Present day audio systems and integrated audio devices can have a plurality of sources that play into a plurality of different types of outputs, for example, an auxiliary input may be reproduced in an earphone amplifier or a DAC output may be played into an earpiece amplifier. In home high fidelity systems the selection is made by a switching device where the transition between sources is controlled so as not to introduce auditable effects of switching between input and output devices. In integrated audio devices a large number of distinct paths can be configured through summing amplifiers that perform a mixing operation. Unwanted sounds, e.g. pops and clicks, may be audible when the different source signals are at a different level when switched into the summing amplifier. A solution to the unwanted sounds could be to effectively mute the output, perform the required switching and then raise output amplitude back to where it was before muting.

The gain accuracy of audio amplifiers is usually determined by fixed value resistance in the feedback of the amplifier where the step size is dependent upon the number of elements in the feedback network and the intended range of the amplifier gain. If the gain is changed with a step size that is too large, for instance >0.01 dB for a 60 dB range, a zipping noise will be introduced. The large number of resistors needed to produce such an effect would make the amplifier device expensive and noncompetitive. Unwanted audio effects can often be eliminated by using discrete components on a PCB, but the cost of components can be in the order of magnitude of the integrated audio device itself.

US 2010/0166084 A1 (Galton et al.) is directed a successive re-quantizer that replaces a delta sigma modulator in a fractional-N PPL or DAC, which avoids spurious tone problems in non-linear analog circuitry. US 2006/0092059 A1 (Guimaraes) is directed to an automatic gain control using a sigma delta ADC. An amplifier is within a sigma delta time continuous loop prior to quantization and an attenuator in the feedback prior to summation with incoming signals. U.S. Pat. No. 7,821,341 B2 (Kim et al.) discloses a gain device with an amplifier that uses the gain device, which uses a linearly variable resistance to control the gain of the amplifier. In U.S. Pat. No. 7,583,213 B2 (Wang et al.) a signal processing system that is directed to changing the level of an input signal to produce an output signal, which includes a shifter, a sigma delta modulator and a level adjuster. U.S. Pat. No. 7,148,829 B2 (Inukai) is directed to a sigma delta modulation circuit having a gain control function, wherein a control unit controls the gain of a variable gain amplifier using a sigma delta modulator and a filter that operates on the output of the sigma delta modulator. In U.S. Pat. No. 7,102,441 B2 (Lee et al.) a variable gain amplifier circuit is directed to a use of a resistor ladder for obtaining a precise gain.

U.S. Pat. No. 6,404,367 B1 (Van der Zwan et al.) is directed to a sigma delta modulator that is used to interchange (chop) the input network and the feedback network to average out the differences in the two gain stages and produce a more accurate gain. U.S. Pat. No. 6,127,893 (Llewellyn et al.) is directed to a control circuit for controlling a level of an audio signal, wherein the control circuit is based on a R-2R resistive network having a plurality of resistor nodes and a plurality of switches to connect the resistors to a low impedance node. An article by Kevin. J Wang, "Spurious Tone Suppression Techniques Applied to a Wide-Bandwidth 2.4 GHZ Fractional-N PPL", IEEE Journal of Solid State Circuits, Vol. 43, No. 12, December 2008, is directed to spurious tones in the output of a fractional-N PLL that are reduced by replacing a sigma delta modulator with a digital quantizer with a charge pump offset and a sampled loop filter. An article by James A. Kaehler, "Periodic-Switched Filter Networks—A means of Amplifying and Varying Transfer Functions", IEEE Journal of Solid State Circuits, vol. sc-4, no. 4, August 1969, is directed to a technique of periodically switching filter networks to allows continuously variable filter parameters.

FIG. 1 shows a variable gain analog amplifier of prior art. An operational amplifier 10 is connected between an input signal, Vin, and an output signal, Vout, created by the operational amplifier. Switches S1 and S2 select the amount of negative feedback resistance connected between the output of the amplifier 10 and the negative input (summing junction) of the operational amplifier 10. The positive input terminal of the amplifier is connected to Vref, which is often ground potential. Selection of either switch S1 or S2 determines the amount of resistance between the input signal Vin and the negative input of the operational amplifier 10. Assuming that Rin=R1=R2, then the gain of the amplifier 10 is $G1=-(R1+R2)/Rin=-2$ when switch S1 is selected, and when switch S2 is selected the gain $G2=-(R2)/(R1+Rin)=-\frac{1}{2}$.

If the two switches S1 and S2 are toggled (turned on and off) at a relatively rapid rate with a fifty percent duty cycle, an average gain of $Gavg=-(2+\frac{1}{2})/2=-1.25$ as shown in FIG. 2 where the two switches are opened and closed out of phase with each other. When Vin 20 applied to the amplifier is a ramp over a span of time t, Vout becomes a ramp 21 interrupted by the two different gains resulting from $G1=-2$ and $G2=-\frac{1}{2}$. The effective, or average output voltage 22 is twenty five percent higher than the input voltage Vin.

A portion of the control signal that drives the switches S1 and S2 can appear at the output of the amplifier, but this can be attenuated by the ratio of the switched resistance to the total resistance, or Rmod=Rsw/Rtot where Rmod is the control signal attenuation, Rsw is the switched resistance and Rtot=Rin+R1+R2. Also some of the high frequency switch control signal can be coupled to the output of the amplifier through parasitic capacitance of the circuitry. The higher the modulating frequency compared to the amplifier gain bandwidth (Fmod=fclk/fbw, where Fmod is the modulating frequency, fclk is the clock rate and fbw is the frequency bandwidth of the amplifier) and the lower Rmod, the lower the amplitude of the control signal that will appear at the output of the amplifier Vout.

SUMMARY OF THE INVENTION

It is an objective of the present invention to increase the gain resolution of an output stage of an audio amplifier.

It is further an objective of the present invention to increase the gain resolution of a programmable gain amplifier beyond that resolution provided by the fixed number of gain elements forming the feedback network of the programmable gain amplifier.

It is still further an objective of the present invention to allow a pop-and-click free switching or mixing between different audio paths without the need of muting the output of the audio amplifier.

It is also further an objective of the present invention to attenuate the switch control signal at the output of the of the audio amplifier.

It is also still further an objective of the present invention that a pulse-density-modulator (PDM) control the gain determining switches of the variable gain audio amplifier.

In the present invention an audio amplifier is formed from a operational amplifier in which negative feed back resistors are selected/deselected by a pulse-density-modulator (PDM) to form the output gain of the operational amplifier used as an audio amplifier. There are a plurality of resistors which can be connected to the summing junction (negative input) of the operational amplifier. If a resistor is not included in the negative feedback network, that resistor is part of the input resistance between the signal input and the negative input of the operational amplifier.

The PDM, preferably a sigma delta modulator (SDM), operates at a frequency higher than the audio bandwidth of the amplifier and selects switches (selecting feedback resistance or gain) of at least two of the plurality of switches that form the feedback of the output of the operational amplifier to the negative input and thus the gain of the amplifier circuit. It should be noted that other forms of pulse density modulation such as a successive quantizer circuit can be used to control the selection of the switches that make up the feedback network of the audio amplifier.

BRIEF DESCRIPTION OF THE DRAWINGS

This invention will be described with reference to the accompanying drawings, wherein:

FIG. 1 is a circuit diagram of prior art of a variable gain operational amplifier;

FIG. 2 is a signal diagram of the operations of the variable gain operational amplifier of prior art;

DETAILED DESCRIPTION OF THE PREFERRED EMBODIMENT

Figure 3:
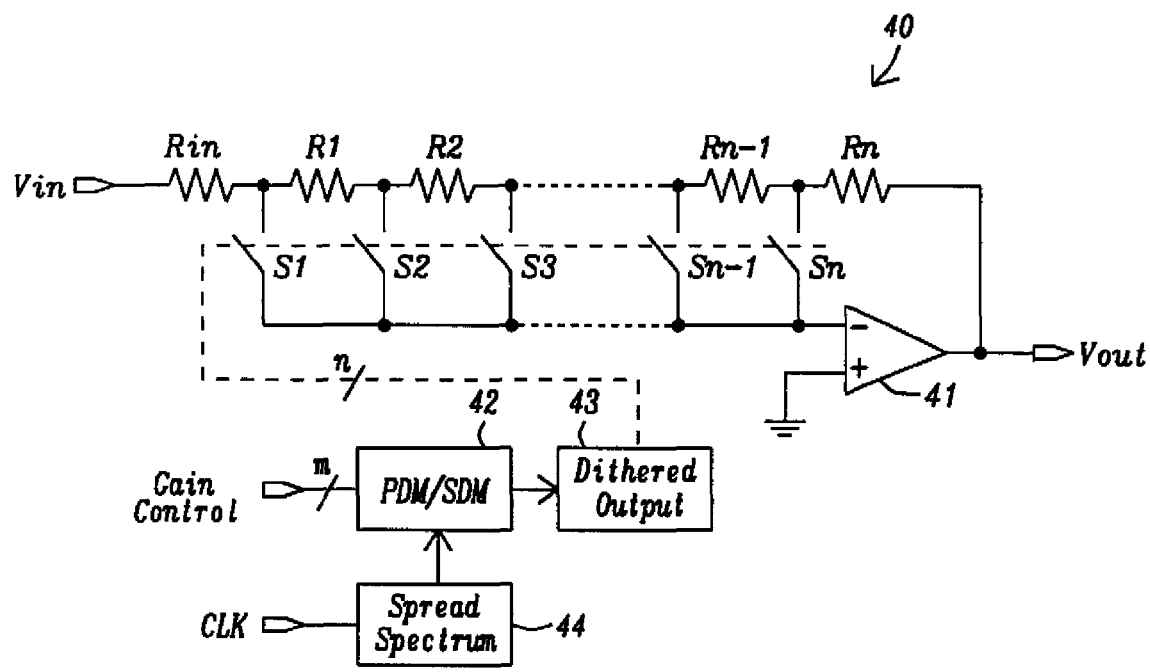
FIG. 3 is a circuit diagram of the audio amplifier of the present invention.

In FIG. 3 is shown a circuit diagram of the variable gain analog amplifier 40 of the present invention. An operational amplifier 41 and a network of resistors Rin and R1 to Rn establish the gain of the analog amplifier. The operational amplifier 41 has the positive input terminal connected to ground; although a reference voltage could be connected to the positive input terminal. There are a plurality of resistors, R1 to Rn, which can be connected between the output and the negative input (summing junction) of the amplifier 41 by the selection of one of a plurality of switches, S1 to Sn. A resistor that is not selected by a switch to be in the negative feedback resistor network of the operational amplifier 41 will form a part of the input resistance with Rin connected between the signal input Vin and the negative terminal of the operational amplifier 41.

The selection of the gain of the analog amplifier 40 by the selecting the switches is controlled by a pulse-density modulator (PDM) 42, which is preferably a sigma-delta modulator (SDM), in response to a gain control signal. The output of the PDM/SDM 42 is dithered 43 to increase the gain resolution of the modulated signal selecting the switches S1 to Sn. The modulator 42 can have multiple outputs, which can be used to select a plurality of resistors simultaneously in the switch network noted by switches S1 to Sn connected to the negative input of the operational amplifier 41, and the modulator 42 uses both oversampling and noise shaping to increase the resolution of the output pulse width without increasing the required timing.

The clock, CLK, is modulated in width by the PDM/SDM 42 will peak above the spectrum of the quantized noise, but will be limited by the modulated gain of the switched resistors. Further reduction of the clock signal can be attained by a spread spectrum 44 that is applied to the clock to spread the power of the clock below the noise floor. The spread spectrum 44 of the clock can also smear the spectrum of an input signal tone depending on the amount of spread spectrum applied. The spectrum of the output of the amplifier Vout (dithered gain) contains at low frequencies the audio content that has been amplified, higher frequencies that are the result of the increased gain resolution, which is shaped by quantization noise (high pass filter response), and a tone, which is the clock frequency that is used to clock the SDM.

High frequency signals at the output connected to earphones are not desired since these high frequency signals could combine with FM signals of the headphone wire that could be used as an antenna. Therefore, it is important to keep quantization noise and the frequency spectrum of the clock at an acceptably low amplitude. The amount of quantization noise can be controlled by the SDM and static gain step used. The amplitude of the clock spectrum at the output is not as easily controlled. The use of a spread spectrum 44 on the clock that drives the SDM is an approach that spreads the clock over a wider frequency spectrum to reduce the amplitude of the clock frequency components that are present in the amplifier output, Vout.

Figure 4:
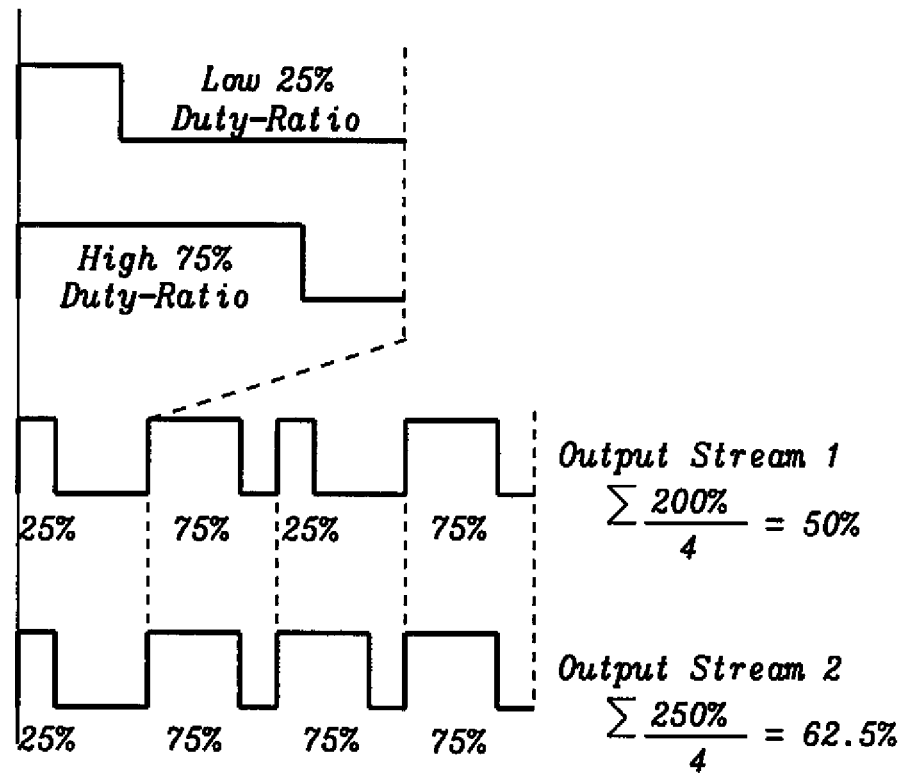
FIG. 4 is a timing diagram of a pulse stream from a sigma-delta modulator modulating the width of a switch control signal.

In FIG. 4 is an example of the timing diagrams for the output pulse stream of a sigma-delta modulator (SDM) 42 that modulates a switch control signal. The use of the SDM to increase the variable gain resolution of the variable gain amplifier 40 eliminates the need for increasing the timing or semiconductor area requirements. In FIG. 4 there is shown a low duty-ratio pulse of 25% and a high duty-ratio pulse of 75%. The pulse width is toggled between duty-ratios such that the average over a period of time is a desired high-resolution value. In the output stream "1" there are two low duty-ratio pulse and two high-duty ratio pulses yielding 200% over four pulses or an average duty-ratio of 50%. In output stream "2" there are one low duty-ratio and three high duty-ratio pulses that yields an average duty-ratio of 62.5%. Thus a single-bit output can be modulated to a higher effective pulse-width resolution. This effect is limited by the rate of change of the pulse-width relative to the rate of change of the gain, or oversampling ratio, which is the number of pulses that are average over an audio time period.

Sigma-delta modulation employs both over sampling and noise-shaping to increase the resolution of the output pulse-width ratio without increasing the timing requirement. Quantizing noise may be shaped at the modulator with feedback such that it is lowered in the band of interest and increased out of band. Lowering of the in-band quantizing noise leads to the increase of pulse-width resolution and, in-turn, gain resolution.

The quantization noise will be present at the output of the amplifier, but it will be limited in amplitude by: the amount/ order of the noise shaping used, the amount of amplifier gain modulation by the switched resistor (Rmod), and the ratio of switching frequency with the gain bandwidth of the amplifier. For a low number of static units in the resistor feedback network and a high resolution in gain, this will result is a small amount of quantization noise, i.e. much below what is normally seen from a headphone output when driven from a typical SDM in a high-fidelity DAC.

Figure 5:
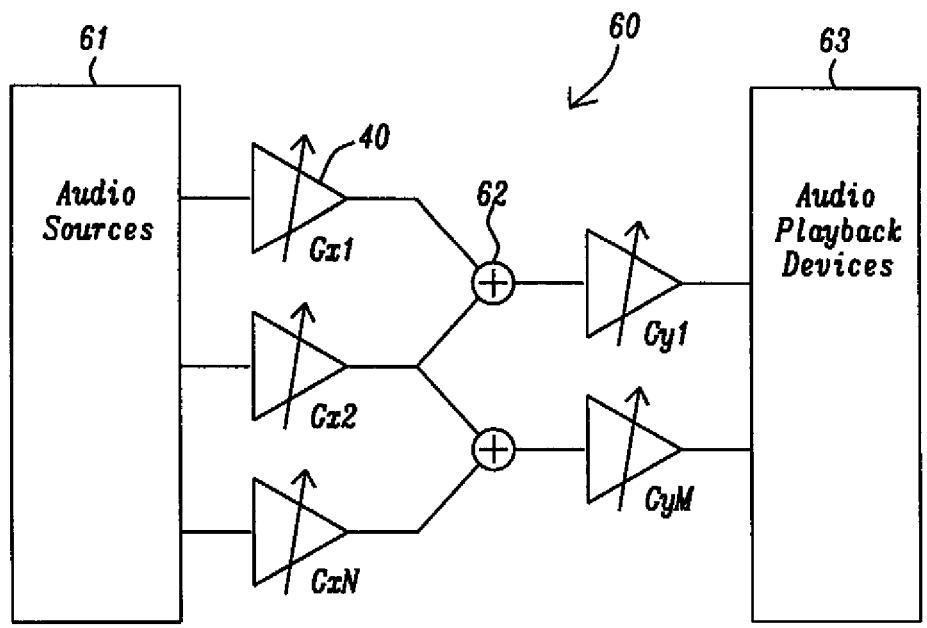
FIG. 5 is a diagram demonstrating usage of a dithered gain amplifier in an audio mixer.

In FIG. 5 is shown a diagram of an application that demonstrates usage of a plurality of dithered gain amplifiers 40 in an audio mixer 60. From a variety of audio sources 61 a plurality of dithered gain amplifiers 40 having gains Gx1 to GxN are connected to summing junctions 62 from which the summed audio sources are connected to audio playback devices 63 through a second plurality of dithered gain amplifiers 40 with gains Gy1 to GyM. The audio playback devices 63 range from headphones and speakers to recording devices.

As a first example, audio content (e.g. using path gain Gx1) is currently being played into an output (e.g. gain Gy1) and the user requires another content to be added to that output (e.g. from path gain Gx2), without muting the output. This is made possible by performing a dithered increase of the gain of the added path (gain Gx2) without changing any other gains. Without the dithered gain the addition of the second content would have unavoidably produced unintended audible effects.

As a second example, before any audio sources or paths are enabled into a given output, the gain of the output stage that is intended (e.g. gain Gy1 in FIG. 6) is dropped in a fashion that is not unpleasant to the user. The dithered gain steps at the output can have a resolution higher than 16 bit precision over the entire gain range, which will make the gain transitions virtually continuous, with no additional audible effects like pop and click. The next step will be to enable all the paths that are intended to be played into that output stage, by increasing their gain (e.g. gain Gx1). This can be done crudely since the intended output is effectively muted. The gain of the intended output gain (gain Gy1) can then be turned on again smoothly with dithering. The small step change in gain at the output will avoid any issues due to circuit offset or signal synchronization, for the mixing or muxing of paths.

While the invention has been particularly shown and described with reference to preferred embodiments thereof, it will be understood by those skilled in the art that various changes in form and details may be made without departing from the spirit and scope of the invention.

What is claimed is:

1. An amplifier, comprising:
   a) a plurality of switches, each of said switches configured to control a gain of said amplifier, wherein said amplifier is a variable gain amplifier;
   b) a switch of said plurality of switches configured to be selected and controlled by a pulse-density modulator (PDM) to produce a signal gain from a time average of a modulated selection of said switch;
   c) a clock connected to the PDM and configured to reduce an amplitude of frequency components of the clock signal in an output of the variable gain amplifier; and
   d) said PDM is configured to produce a dithered output to increase resolution of the signal gain of the variable gain amplifier, wherein said dithered output of the PDM is configured to produce a quiet, inaudible merging and mixing of audio signals into an audio output or playback device.

2. The amplifier of claim 1, wherein said PDM is a sigma delta modulator.

3. The amplifier of claim 2, wherein said sigma-delta modulator is a multi-bit sigma-delta modulator that is configured to control a simultaneous selection of said plurality of switches to select the gain setting of the variable gain amplifier.

4. The amplifier of claim 1, wherein said plurality of switches is at least two switches.

5. The amplifier of claim 1, wherein the amplifier is an audio amplifier.

6. The amplifier of claim 5, wherein the audio amplifier is a variable gain audio amplifier.

7. A method for improving gain of an amplifier, comprising:
   a) applying an input signal to said amplifier, wherein said amplifier is a variable gain amplifier;
   b) selecting a resistor from a multiple resistor feedback network of said variable gain amplifier;
   c) modulating a selection signal of said resistor using a pulse-density modulator (PDM), wherein said PDM clocked by a clock signal connected to the PDM through a spread spectrum to reduce the clock signal presence in an analog output signal; and
   d) producing said analog output signal that is an average response of said input signal to the PDM modulation of the selection of resistors in the feedback network of said variable gain amplifier.

8. The method of claim 7, wherein said PDM is a sigma-delta modulator.

9. The method of claim 8, wherein said sigma-delta modulator is a multi-bit sigma-delta modulator that controls a selection of a plurality of resistors simultaneously in the multiple resistor feedback network.

10. The method of claim 7, wherein said amplifier is an operational amplifier wherein the multiple resistor feedback is connected between an output and a negative input of the amplifier.

11. The method of claim 10, wherein selecting said resistor from the multiple resistor feedback network comprises a switch that connects a first contact of said resistor to a negative input terminal of said amplifier, wherein a second contact of said resistor connected to an output of the amplifier through other resistors of the multiple resistor feedback and directly to the output of the amplifier when said resistor is a last resistor of said feedback network.

12. The method of claim 7, wherein modulating the selection of said resistor averages a gain of the amplifier between the time when the resistor is selected and when the resistor is not selected.

13. The method of claim 7, wherein increasing the gain resolution of the amplifier is accomplished by dithering the output of said PDM.

14. The method of claim 7, wherein the input signal is an input analog signal and the output signal is an output analog signal.

15. The method of claim 7, wherein the amplifier is an analog amplifier.

16. The method of claim 15, wherein the analog amplifier is a variable gain analog amplifier.

* * * * *